US011827983B2

(12) United States Patent
Rimmer et al.

(10) Patent No.: US 11,827,983 B2
(45) Date of Patent: Nov. 28, 2023

(54) APPARATUS AND PROCESS FOR DETERMINING THE DISTANCE BETWEEN A GLASS SUBSTRATE AND A COATER

(71) Applicant: PILKINGTON GROUP LIMITED, Lathom (GB)

(72) Inventors: David Rimmer, St. Helens (GB); Ian Ross Williams, Wigan (GB); Stephen Roland Day, Wigan (GB); Peter Michael Harris, Chester (GB); David Evans, Scarisbrick (GB)

(73) Assignee: Pilkington Group Limited, Lathom (GB)

( * ) Notice: Subject to any disclaimer, the term of this patent is extended or adjusted under 35 U.S.C. 154(b) by 175 days.

(21) Appl. No.: 17/429,658

(22) PCT Filed: Feb. 14, 2020

(86) PCT No.: PCT/GB2020/050343
§ 371 (c)(1),
(2) Date: Aug. 10, 2021

(87) PCT Pub. No.: WO2020/165597
PCT Pub. Date: Aug. 20, 2020

(65) Prior Publication Data
US 2022/0205104 A1   Jun. 30, 2022

(30) Foreign Application Priority Data
Feb. 14, 2019   (GB) ..................... 1902032

(51) Int. Cl.
*C23C 16/52*    (2006.01)
*C03C 17/00*    (2006.01)
(Continued)

(52) U.S. Cl.
CPC ........... *C23C 16/52* (2013.01); *C03C 17/001* (2013.01); *C23C 16/4581* (2013.01); *G01B 7/023* (2013.01); *C03C 2218/152* (2013.01)

(58) Field of Classification Search
CPC ................. G01B 7/023; C23C 16/52
See application file for complete search history.

(56) References Cited

U.S. PATENT DOCUMENTS 5,298,073 A      3/1994   Wilson
5,318,928 A  *   6/1994   Gegenwart ........... G01L 1/2293
                                                     257/E21.279

(Continued)

FOREIGN PATENT DOCUMENTS

WO   WO 2012/166313 A2   12/2012
WO   WO 2014/144533 A1    9/2014

OTHER PUBLICATIONS

J.K. Intellectual Property Office, Search Report issued in GB1902032. 0, dated Apr. 29, 2019, 2 pages, U. K. Intellectual Property Office, Newport, South Wales.

(Continued)

Primary Examiner — Joseph A Miller, Jr.
(74) Attorney, Agent, or Firm — Marshall & Melhorn, LLC (57) ABSTRACT

A combination of a chemical vapour deposition (CVD) coater and at least one capacitive proximity sensor, comprising: a CVD coater, and at least one capacitive proximity sensor attached to the CVD coater, wherein the at least one capacitive proximity sensor is arranged to determine the distance between a glass substrate and the CVD coater.

17 Claims, 3 Drawing Sheets

(51) Int. Cl.
   *C23C 16/458* (2006.01)
   *G01B 7/02* (2006.01)

(56) References Cited

U.S. PATENT DOCUMENTS

| | | | |
|---|---|---|---|
| 7,871,470 B2 | 1/2011 | Schieve et al. | |
| 9,245,786 B2 | 1/2016 | Koelmel et al. | |
| 9,469,559 B2 | 10/2016 | Jiao et al. | |
| 10,106,450 B2 | 10/2018 | Jiao et al. | |
| 10,312,120 B2 | 6/2019 | Ravid et al. | |
| 2006/0030135 A1* | 2/2006 | Hu | C23C 18/00 438/758 |
| 2010/0013626 A1 | 1/2010 | Park et al. | |
| 2015/0376782 A1* | 12/2015 | Griffin | C23C 16/45544 118/712 |
| 2018/0073143 A1 | 3/2018 | Masuda | |
| 2019/0244842 A1 | 8/2019 | Ravid et al. | |

OTHER PUBLICATIONS

European Patent Office, International Search Report with Written Opinion issued in PCT/GB2020/050343, dated May 19, 2020, 11 pages, European Patent Office, Rijswijk, Netherlands.

* cited by examiner

APPARATUS AND PROCESS FOR DETERMINING THE DISTANCE BETWEEN A GLASS SUBSTRATE AND A COATER

BACKGROUND OF THE INVENTION

This invention concerns an apparatus and process for determining the distance between a glass substrate and a coater. More specifically the invention relates to the coating of a glass substrate via chemical vapour deposition (CVD), and particularly the sensing of the position of a coater relative to the position of a glass substrate upon which a coating is to be formed. It is desirable to provide a quick and repeatable way of setting the height of a coater to ensure reproducibility of coatings. Moreover, an approach that prevents a coater from being lowered into a glass substrate, such as a glass ribbon in a float glass manufacturing process, causing breakage of the substrate and damage to the coater, would be advantageous. Such an approach could also beneficially provide warning signals to alert an operator to the proximity of the coater to the glass substrate.

A known approach to determine the spacing between a glass ribbon and a coater is described in U.S. Pat. No. 5,298,073, which concerns the use of differential pressure. Position sensors are affixed to the coater at selected positions therealong. The sensors include an annular outlet through which a compatible gas is discharged against the glass surface from a position closely adjacent the surface, and a central opening for measuring the back pressure resulting from impingement of the gas against the glass surface. The back pressure is a function of the distance of the annular outlet from the glass surface, and the size of the annular passageway and rate of gas flow therethrough are such that a smooth well-defined pressure-versus-distance curve is produced for the range of distances within which the coater is intended to operate. Comparison of observed pressures with pressures at known distances indicate the sensor-to-glass, and hence the coater-to-glass, distance.

However, there are disadvantages associated with the differential pressure approach. For instance, this technique requires a complex arrangement of pipes and there can be issues concerning calibration and sensitivity to gas pressure changes.

Accordingly it would be advantageous to provide an approach that at least alleviates and preferably solves the aforementioned problems.

According to a first aspect of the present invention there is provided a combination of a chemical vapour deposition (CVD) coater and at least one capacitive proximity sensor, comprising:

a CVD coater, and at least one capacitive proximity sensor attached to the CVD coater, wherein the at least one capacitive proximity sensor is arranged to determine the distance between a glass substrate and the CVD coater.

It was surprisingly found that the combination of the first aspect provides a convenient and accurate way of determining the distance between a glass substrate and a CVD coater. This combination enables real-time monitoring of the height of a coater without the characteristic drawbacks of the known approaches.

In the following discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

Throughout this specification, the term "comprising" or "comprises" means including the component(s) specified but not to the exclusion of the presence of other components. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, when referring to compositions, a composition consisting essentially of a set of components will comprise less than 5% by weight, typically less than 3% by weight, more typically less than 1% by weight of non-specified components.

The term "consisting of" or "consists of" means including the components specified but excluding other components.

Whenever appropriate, depending upon the context, the use of the term "comprises" or "comprising" may also be taken to include the meaning "consists essentially of" or "consisting essentially of", and also may be taken to include the meaning "consists of" or "consisting of".

References herein such as "in the range x to y" are meant to include the interpretation "from x to y" and so include the values x and y.

Preferably the capacitive proximity sensor comprises a sensor unit and a control unit. Preferably the sensor unit and the control unit are arranged to be electrically coupled to each other when in use. The sensor unit and the control unit may be electrically coupled to each other by a cable or other suitable means when in use. Preferably the capacitive proximity sensor comprises the sensor unit, the control unit and the cable. Preferably the cable is thermally insulated, more preferably thermally insulated with one or more of ceramic, silicone rubber, glass fibre, mica and magnesium oxide. Alternatively or additionally the temperature of the cable may be regulated in use by encasing at least part, preferably all, of the cable in a conduit that contains coolant means. Preferably the coolant means comprises water or oil. Preferably the water or oil is recirculated. Preferably the sensor unit and the cable can operate at temperatures of at least 650° C., more preferably at least 700° C., even more preferably at least 750° C., most preferably at least 800° C.

Preferably the capacitive proximity sensor is arranged to determine the distance between a surface of the glass substrate and a surface of the CVD coater. Said surface of the glass substrate may be coated such that the capacitive proximity sensor is arranged to determine the distance between a surface of the coating and a surface of the CVD coater. Preferably said surface of the glass substrate is a surface that is nearest to the CVD coater. Preferably said surface of the CVD coater is a surface that is nearest to the glass substrate.

Preferably the CVD coater is arranged to move to change the distance between a surface of the glass substrate and a surface of the CVD coater. In use preferably the glass substrate lies stationary in a plane or moves within a plane and the CVD coater is arranged to move to change the distance between the plane and a surface of the CVD coater. Preferably the CVD coater is arranged to move substantially perpendicular to the plane to change the distance between the plane and a surface of the CVD coater.

Preferably the sensor unit comprises a sensor electrode. Preferably the sensor electrode comprises one or more of copper, graphite, titanium, brass, silver, platinum, palladium, steel and a mixed metal oxide. The sensor electrode may be any suitable shape such as cylindrically shaped or cuboid shaped. Preferably an end of the sensor electrode faces the glass substrate in use.

Preferably the sensor electrode is at least partially surrounded by an electrically insulating material such as one or more of ceramic, silicone rubber, glass fibre, mica and magnesium oxide. Alternatively or additionally the sensor electrode is at least partially surrounded by an electrically insulating air gap. Preferably the electrically insulating material is at least partially surrounded by a guard ring. Preferably the guard ring comprises one or more of copper, graphite, titanium, brass, silver, platinum, palladium, steel and a mixed metal oxide. Preferably the guard ring is at least partially surrounded by an electrically insulating material such as one or more of ceramic, silicone rubber, glass fibre, mica and magnesium oxide. Alternatively or additionally the guard ring is at least partially surrounded by an electrically insulating air gap.

Preferably the combination comprises more than one capacitive proximity sensor attached to the CVD coater, more preferably more than two capacitive proximity sensors attached to the CVD coater, even more preferably more than three. A greater number of sensors is advantageous for situations where the glass substrate and/or the CVD coater is not level (i.e. the glass substrate and/or the CVD coater are positioned in non-parallel planes), such that the CVD coater could conceivably contact the glass substrate even though a sensor indicates that it is spaced apart from the glass substrate. Preferably the sensor unit of each capacitive proximity sensor is located in a region of a perimeter of the CVD coater. Preferably the sensor unit of each capacitive proximity sensor is located such that an end of the sensor unit is substantially level, preferably level, with a lower surface of the CVD coater. Preferably the lower surface of the CVD coater is a surface that is nearest to the glass substrate. Preferably the sensor unit of each capacitive proximity sensor is located such that an end of the sensor electrode is substantially level, preferably level, with a lower surface of the CVD coater. Preferably each capacitive proximity sensor is located in a region of a perimeter of the CVD coater. Preferably each capacitive proximity sensor is located in a region of a corner of the lower surface of the CVD coater.

Preferably the CVD coater is substantially cuboid. Preferably the CVD coater comprises two lateral surfaces, a front surface, a back surface, an upper surface and a lower surface. Preferably the two lateral surfaces are opposite each other and are both connected to and perpendicular to the front and back surfaces which are opposite each other. Preferably the upper and lower surfaces are opposite each other and are both connected to the lateral, front and back surfaces. Preferably the one or more gas distributor passage extends across the lower surface between and perpendicular to the lateral surfaces. Preferably, when in use if the glass substrate is moving the direction of travel is from the front surface to the back surface of the CVD coater i.e. parallel to the lateral surfaces. Preferably each capacitive proximity sensor, preferably a sensor unit of each capacitive proximity sensor, is attached to the front or back surface of the CVD coater such that an end of the sensor electrode is substantially level, preferably level, with the lower surface of the CVD coater. Alternatively, or additionally, preferably each capacitive proximity sensor, preferably a sensor unit of each capacitive proximity sensor, is attached to the front or back surface of the CVD coater adjacent to where said surface meets a lateral surface.

Preferably the temperature of at least part of the coater is regulated, more preferably regulated using coolant means. Preferably the coolant means comprises water or an oil, preferably an oil. Preferably the coater comprises one or more gas distributor passages. Preferably one or more gas distributor passage can be utilized to discharge gaseous mixtures. Preferably said one or more gas distributor passage comprises one or more internal walls defining the passage. Preferably said one or more gas distributor passage extends transversely across the glass substrate in use. Preferably said one or more gas distributor passage has a slot-like configuration. Preferably said one or more gas distributor passage is arranged to discharge a curtain of a gaseous mixture. Preferably the temperature of the internal walls of the gas distributor passages is regulated using a coolant means. Preferably the coolant means comprises an oil.

Preferably the sensor unit is at least partially surrounded by a housing. Preferably part of the CVD coater constitutes part of the housing e.g. an external wall of the coater may constitute a wall of the housing. Preferably the temperature of the part of the CVD coater that constitutes part of the housing is regulated as described in the preceding paragraph. Preferably the temperature of the sensor unit is regulated by the part of the coater that constitutes part of the housing. Thereby the temperature of the sensor unit can be controlled such that it does not become too high (e.g. >750° C.) since such high temperatures can detrimentally affect sensor performance.

Preferably the sensor electrode comprises at least one exposed part that is not surrounded by the housing or any part of the sensor unit. The sensor unit is preferably arranged such that the at least one exposed part of the sensor electrode faces the glass substrate in use. Preferably the at least one exposed part of the sensor electrode that faces the glass substrate in use is an end of the sensor electrode. The at least one exposed part of the sensor electrode preferably has a flat surface.

Preferably at least part of the sensor unit is protected from the surrounding atmosphere by an anti-fouling coating and/or an anti-fouling sheet. Such an arrangement prevents the sensor from becoming contaminated with coating material and float bath atmosphere debris which can affect the sensor's ability to provide accurate measurements. This approach also protects the sensor during coater cleaning and maintenance activities.

Preferably the sensor unit comprises a sensor electrode and preferably at least part of the sensor electrode is protected from the surrounding atmosphere by an anti-fouling coating and/or an anti-fouling sheet. Preferably the at least one exposed part of the sensor electrode is protected from the surrounding atmosphere by an anti-fouling coating and/or an anti-fouling sheet. Preferably any part of the sensor electrode that would otherwise be exposed to the surrounding atmosphere is protected from the surrounding atmosphere by an anti-fouling coating and/or an anti-fouling sheet. Preferably any part of the sensor unit that would otherwise be exposed to the surrounding atmosphere is protected from the surrounding atmosphere by an anti-fouling coating and/or an anti-fouling sheet.

Preferably the anti-fouling coating comprises a non-conductive material. Preferably the anti-fouling coating comprises one or more of bicarbonates such as sodium bicarbonate and calcium bicarbonate, sulphates such as sodium sulphate and calcium sulphate, nitrides such as boron nitride and aluminium nitride, low boiling point hydrogen treated naphtha, silazanes such as polysilazanes, alkali silicates, silicas and/or organo silicas. Preferably the anti-fouling coating is removable. A removable coating enables the removal of any contaminants that may have adhered to the coating during use. Preferably the anti-fouling coating can be removed using a solvent such as an organic solvent. Preferably the organic solvent is an alcohol such as iso-propyl alcohol or ethanol.

Preferably the anti-fouling sheet comprises one or more of alumina, quartz, zirconia and/or a non-conductive ceramic. Preferably the anti-fouling sheet is disc shaped. Preferably the housing or the sensor unit comprises a holder suitable for holding the anti-fouling sheet. Preferably the holder comprises a slot arranged to accept the anti-fouling sheet. Preferably the anti-fouling sheet is held in the holder. This arrangement is beneficial because the anti-fouling sheet can be conveniently attached to the housing or the sensor unit before the coater is utilised, cleaned or maintained and then removed easily afterwards along with any contaminants that may have adhered to the sheet.

Preferably the anti-fouling sheet has a thickness of at least 0.01 mm, more preferably at least 0.1 mm, even more preferably at least 0.3 mm, most preferably at least 0.4 mm, but preferably at most 3 mm, more preferably at most 1 mm, even more preferably at most 0.7 mm, most preferably at most 0.6 mm. These preferred thicknesses are advantageous in terms of providing enough protection without detrimentally affecting sensor performance.

Preferably the sensor unit is arranged to detect the distance between the glass substrate, which may be coated, and the CVD coater. In particular, preferably the sensor electrode is arranged to detect the distance between the glass substrate and the CVD coater. Preferably the sensor unit is arranged to send signals to the control unit, wherein said signals indicate the distance between the glass substrate and the CVD coater. Preferably the sensor unit is arranged to send said signals to the control unit by a cable or other suitable means when in use. Preferably the control unit is arranged to indicate the distance between the glass substrate and the CVD coater. Preferably the control unit provides means for an operator to control the distance between the glass substrate and the CVD coater, e.g. the control unit may be arranged to automatically maintain a constant distance between the glass substrate and the CVD coater. Such an arrangement ensures that an operator does not need to personally continually monitor the distance between the glass substrate and the CVD coater in order to take into account any fluctuations in the position of the glass substrate relative to the CVD coater. Changes in the position of a glass substrate can occur due to various reasons such as issues with the equipment conveying the glass substrate or, when the glass substrate is a molten glass ribbon manufactured as part of the float glass process, waves in an underlying tin bath can lead to such fluctuations. Being able to nullify such fluctuations is important because they can cause inconsistencies in coating thickness and quality.

Preferably the control unit is arranged to warn an operator if the CVD coater is closer to the glass substrate than a pre-determined minimum distance. Such a warning may be audible and/or visual. It is beneficial to avoid the CVD coater contacting the glass substrate since such an occurrence can damage the CVD coater, the glass substrate and any equipment or materials underlying the glass substrate e.g. a tin bath.

Preferably the combination of a CVD coater and at least one capacitive proximity sensor is suitable for use during the float glass manufacturing process. For example, the combination may be suitable for use as part of a float glass installation, such as part of a float bath section, an annealing lehr and/or a lehr gap. Preferably the glass substrate was formed utilizing the well-known float glass manufacturing process. In this embodiment, the glass substrate may also be referred to as a glass ribbon. Preferably the combination of the first aspect is utilized during the float glass manufacturing process. However, it should be appreciated that the combination can be utilized apart from the float glass manufacturing process or well after formation and cutting of the glass ribbon.

According to a second aspect of the present invention there is provided a capacitive proximity sensor for attaching to a CVD coater, comprising:

a sensor unit, and a control unit, wherein the capacitive proximity sensor is arranged to determine the distance between a glass substrate and the CVD coater, and wherein at least part of the sensor unit is protected from the surrounding atmosphere by an anti-fouling coating and/or an anti-fouling sheet.

It has surprisingly been found that the sensor according to the second aspect is particularly suited to determining the distance between a glass substrate and a CVD coater. The sensor can reliably operate in CVD coating environments without becoming contaminated with coating material and float bath atmosphere debris which can affect the sensor's ability to provide accurate measurements. The sensor is also protected during coater cleaning and maintenance activities.

Preferably the capacitive proximity sensor is suitable for use during the float glass manufacturing process.

According to a third aspect of the present invention there is provided a process for determining the distance between a glass substrate and a CVD coater, comprising the following steps:

i) providing a glass substrate and a combination of a CVD coater and a capacitive proximity sensor in accordance with the first aspect of the present invention, and ii) using the capacitive proximity sensor to determine the distance between the glass substrate and the CVD coater.

This process provides a convenient and accurate way of determining the distance between a glass substrate and a CVD coater, enabling real-time monitoring of the height of a coater without the characteristic drawbacks of the known approaches.

The process may preferably be carried out when the glass substrate is at a temperature in the range 350° C. to 800° C., more preferably when the glass substrate is at a temperature in the range 550° C. to 770° C. Carrying out the process when the glass substrate is at these preferred temperatures means that the glass substrate is conductive and therefore the capacitance is measured between the sensor and the glass substrate. This arrangement enables a simpler way of determining the distance than if the glass substrate is non-conductive in which case a stationary reference target would be necessary.

The process may be carried out in conjunction with the manufacture of the glass substrate, e.g. the glass substrate may be formed utilizing the float glass manufacturing process. Conveniently the process may be carried out in a float glass installation, such as in a float bath section, in an annealing lehr and/or in a lehr gap. The lehr gap is defined as the region between a float bath and an annealing lehr. In the lehr gap the ambient atmosphere may change from a reducing atmosphere of a float bath to an oxidizing (air ambient) atmosphere in the annealing lehr.

Preferably, the CVD coater extends transversely across the glass substrate and is preferably provided at a distance thereabove. In certain embodiments, gaseous mixtures may be fed through the CVD coater and discharged from the CVD coater utilizing one or more gas distributor passage (sometimes called a beam) during the process. Preferably, each gaseous mixture is formed prior to being fed through the CVD coater. For example, the precursor compounds may be mixed in a feed line connected to an inlet of the CVD coater. In other embodiments, one or more gaseous mixture may be formed within the CVD coater. Preferably said one or more gas distributor passage comprises one or more internal walls defining the passage. Preferably said one or more gas distributor passage extends transversely across the glass substrate. Preferably said one or more gas distributor passage has a slot-like configuration. Preferably said one or more gas distributor passage is arranged to discharge a curtain of a gaseous mixture.

Preferably the CVD coater is arranged to move to change the distance between a surface of the glass substrate and a surface of the CVD coater. In use preferably the glass substrate lies stationary in a plane or moves within a plane and the CVD coater is arranged to move to change the distance between the plane and a surface of the CVD coater. Preferably the CVD coater is arranged to move substantially perpendicular to the plane to change the distance between the plane and a surface of the CVD coater.

Preferably the glass substrate is moving during the process. Preferably, the glass substrate moves at a predetermined rate of, for example, greater than 3 m/min during the process. More preferably the glass substrate is moving at a rate of between 3 m/min and 20 m/min during the process.

Preferably the process is carried out during the float glass manufacturing process at substantially atmospheric pressure. Alternatively the process may be carried out using low-pressure or ultrahigh vacuum. The CVD coater may be an aerosol assisted CVD coater or a direct liquid injection CVD coater. Furthermore, the CVD coater may be a microwave plasma-assisted CVD coater, a plasma-enhanced CVD coater, a remote plasma-enhanced CVD coater, an atomic layer CVD coater, a combustion CVD coater (flame pyrolysis), a hot wire CVD coater, a metalorganic CVD coater, a rapid thermal CVD coater, a photo-initiated CVD coater or use vapour phase epitaxy.

The glass substrate may be a clear metal oxide-based glass ribbon or pane. The glass ribbon or pane may be a clear or tinted float glass ribbon or pane. A typical soda-lime-silicate glass composition is (by weight), $SiO_2$ 69-74%; $Al_2O_3$ 0-3%; $Na_2O$ 10-16%; $K_2O$ 0-5%; MgO 0-6%; CaO 5-14%; $SO_3$ 0-2% and $Fe_2O_3$ 0.005-2%. The glass composition may also contain other additives, for example, refining aids, which would normally be present in an amount of up to 2%. By clear float glass, it is meant a glass having a composition as defined in BS EN 572-1 and BS EN 572-2 (2004). For clear float glass, the $Fe_2O_3$ level by weight is typically 0.11%. Float glass with an $Fe_2O_3$ content less than about 0.05% by weight is typically referred to as low iron float glass. Such glass usually has the same basic composition of the other component oxides i.e. low iron float glass is also a soda-lime-silicate glass, as is clear float glass. Typically tinted float glass has at least 0.5% by weight $Fe_2O_3$, e.g. 1.0% by weight $Fe_2O_3$. Alternatively the glass ribbon or pane is a borosilicate-based glass ribbon or pane, an alkali-aluminosilicate-based glass ribbon or pane, or an aluminium oxide-based crystal glass ribbon or pane.

According to a fourth aspect of the present invention there is provided the use of a capacitive proximity sensor to determine the distance between a glass substrate and a CVD coater.

According to a fifth aspect of the present invention there is provided the use of an anti-fouling coating and/or an anti-fouling sheet to protect a capacitive proximity sensor attached to a CVD coater.

Any feature set out above in relation to any aspect of the present invention may also be utilised in relation to any other aspect of the present invention. Any invention described herein may be combined with any feature of any other invention described herein mutatis mutandis. It will be appreciated that optional features applicable to one aspect of the invention can be used in any combination, and in any number. Moreover, they can also be used with any of the other aspects of the invention in any combination and in any number. This includes, but is not limited to, the dependent claims from any claim being used as dependent claims for any other claim in the claims of this application.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

BRIEF DESCRIPTION OF THE DRAWINGS

The invention will now be further described by way of the following specific embodiments, which are given by way of illustration and not of limitation, with reference to the accompanying drawings in which.

DETAILED DESCRIPTION OF THE INVENTION

As discussed above, the present invention may be utilized in conjunction with the manufacture of the glass substrate in the float glass process. The float glass process is typically carried out utilizing a float glass installation such as the installation 10 depicted in FIG. 1. However, it should be understood that the float glass installation 10 described herein is only illustrative of such installations.

Figure 1:
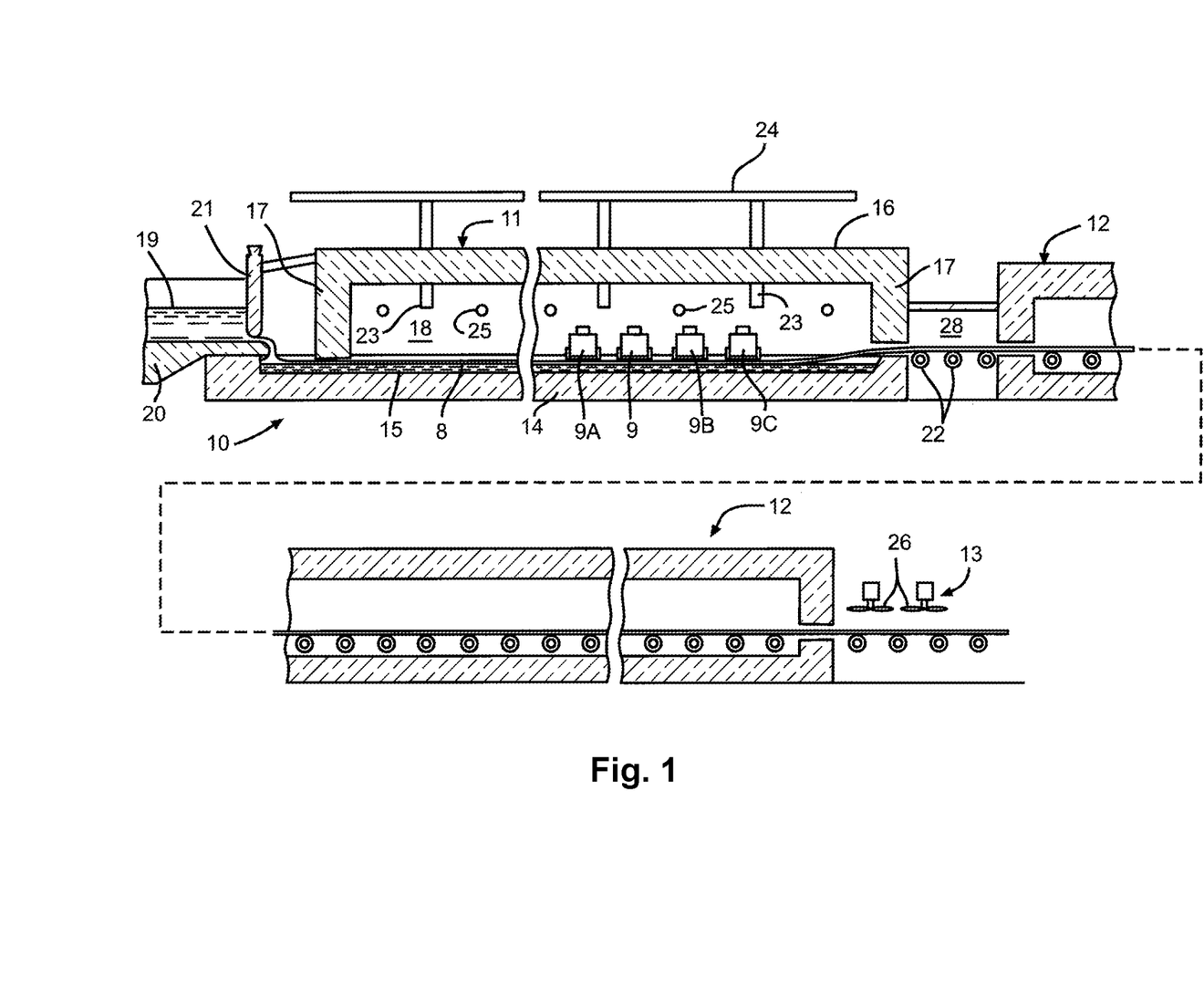
FIG. 1 is a schematic view, in vertical section, of an installation for practicing the float glass process which incorporates several CVD coaters to which capacitive proximity sensors are attached in accordance with the present invention.

As illustrated in FIG. 1, the float glass installation 10 may comprise a canal section 20 along which molten glass 19 is delivered from a melting furnace, to a float bath section 11 wherein the glass substrate is formed. In this embodiment, the glass substrate will be referred to as a glass ribbon 8. However, it should be appreciated that the glass substrate is not limited to being a glass ribbon. The glass ribbon 8 advances from the bath section 11 through an adjacent annealing lehr 12 and a cooling section 13. The float bath section 11 includes: a bottom section 14 within which a bath of molten tin 15 is contained, a roof 16, opposite side walls (not depicted) and end walls 17. The roof 16, side walls and end walls 17 together define an enclosure 18 in which a non-oxidizing atmosphere is maintained to prevent oxidation of the molten tin 15.

In operation, the molten glass 19 flows along the canal 20 beneath a regulating tweel 21 and downwardly onto the surface of the tin bath 15 in controlled amounts. On the molten tin surface, the molten glass 19 spreads laterally under the influence of gravity and surface tension, as well as certain mechanical influences, and it is advanced across the tin bath 15 to form the glass ribbon 8. The glass ribbon 8 is removed from the bath section 11 over lift out rolls 22 and is thereafter conveyed through the annealing lehr 12 and the cooling section 13 on aligned rolls. The deposition of coatings preferably takes place in the float bath section 11, although it may be possible for deposition to take place further along the glass production line, for example, in the gap 28 between the float bath 11 and the annealing lehr 12, or in the annealing lehr 12.

As illustrated in FIG. 1, four CVD coaters 9, 9A, 9B, 9C are shown within the float bath section 11. One or more additional coaters may be provided. Also, a description of a CVD coater suitable for practicing the present invention can be found in U.S. patent application Ser. No. 61/466,501. Not depicted in FIG. 1 are sixteen capacitive proximity sensors, each located in a region of a corner of the lower surface of each CVD coater. One or more CVD coaters combined with capacitive proximity sensors may alternatively or additionally be located in the lehr gap 28. Any by-products are removed through coater extraction slots and then through a pollution control plant.

A suitable non-oxidizing atmosphere, generally nitrogen or a mixture of nitrogen and hydrogen in which nitrogen predominates, may be maintained in the float bath section 11 to prevent oxidation of the molten tin 15 comprising the float bath. The atmosphere gas is admitted through conduits 23 operably coupled to a distribution manifold 24. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For the purposes of describing the invention, the above-noted pressure range is considered to constitute normal atmospheric pressure.

CVD is generally performed at essentially atmospheric pressure. Thus, the pressure of the float bath section 11, annealing lehr 12, and/or in the gap 28 between the float bath 11 and the annealing lehr 12 may be essentially atmospheric pressure. Heat for maintaining the desired temperature regime in the float bath section 11 and the enclosure 18 is provided by radiant heaters 25 within the enclosure 18. The atmosphere within the lehr 12 is typically atmospheric air, as the cooling section 13 is not enclosed and the glass ribbon 8 is therefore open to the ambient atmosphere. The glass ribbon 8 is subsequently allowed to cool to ambient temperature. To cool the glass ribbon 8, ambient air may be directed against the glass ribbon 8 by fans 26 in the cooling section 13. Heaters (not shown) may also be provided within the annealing lehr 12 for causing the temperature of the glass ribbon 8 to be gradually reduced in accordance with a predetermined regime as it is conveyed therethrough.

Figure 2:
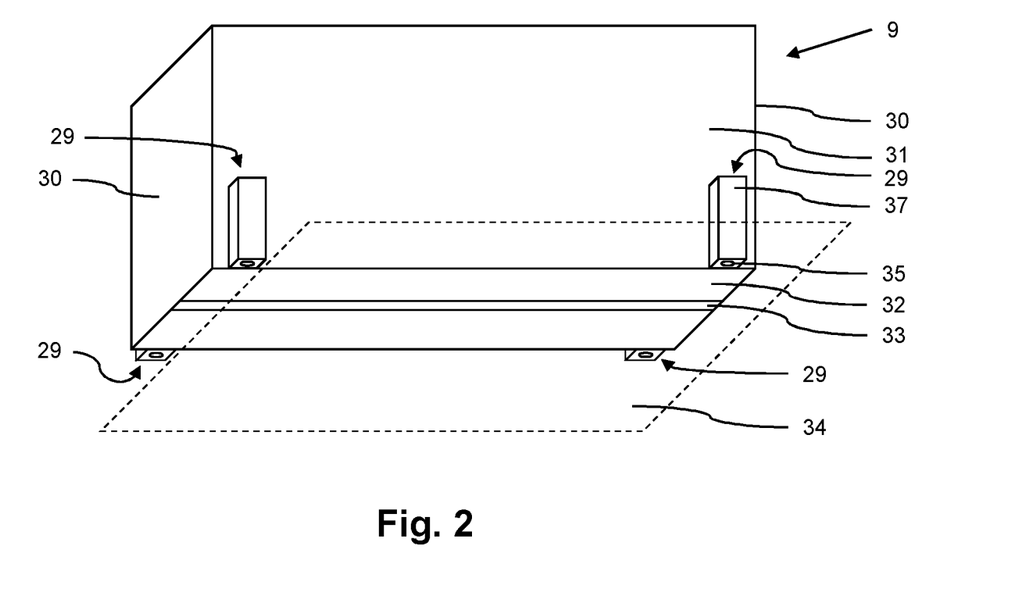
FIG. 2 is a perspective view of the lower surface, the back surface and a lateral surface of a CVD coater to which capacitive proximity sensors are attached in accordance with the present invention.

FIG. 2 shows an underside perspective view of a CVD coater 9 to which four capacitive proximity sensors 29 are attached in accordance with the present invention. CVD coater 9 is generally cuboid-shaped with lateral surfaces 30 connected to front (not shown) and back surfaces 31. Lower surface 32 has a gas distributor passage 33 extending across the lower surface 32 between and perpendicular to the lateral surfaces 30. A glass substrate 34 is shown in outline below the CVD coater 9 adjacent the lower surface 32. In use, if the glass substrate 34 is moving (e.g. in a dynamic process like the float glass manufacturing process) the direction of travel is from the front surface to the back surface 31 of the CVD coater 9 i.e. parallel to the lateral surfaces 30. Two capacitive proximity sensors 29 are attached to each of the front surface and the back surface 31 of the CVD coater 9 such that an end of each sensor electrode 35 is level with the lower surface 32 of the CVD coater 9. The capacitive proximity sensors 29 are attached to the CVD coater 9 by means of sensor units 37 partially surrounded by housings (associated cable and control unit are not depicted). The capacitive proximity sensors 29 are attached to the front or back surface 31 of the CVD coater 9 adjacent to where said surface meets a lateral surface 30. This frequency and location of capacitive proximity sensors 29 is beneficial since it counteracts situations where the glass substrate 34 and/or the CVD coater 9 is not level (i.e. the glass substrate and/or the CVD coater are positioned in non-parallel planes), such that the CVD coater could conceivably contact the glass substrate even though a sensor indicates that it is spaced apart from the glass substrate.

Figure 3:
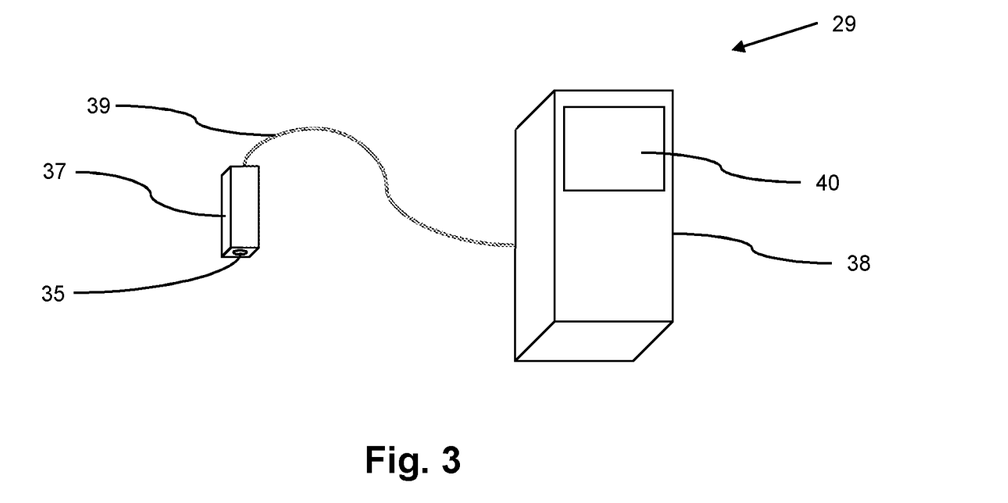
FIG. 3 is a perspective view of a capacitive proximity sensor in accordance with the present invention.

FIG. 3 shows a perspective view of a capacitive proximity sensor 29 in accordance with the present invention. Sensor 29 comprises sensor unit 37 partially surrounded by a housing connected to control unit 38 via cable 39. Control unit 38 has a touchscreen 40 which is arranged to display information regarding the proximity of the sensor unit 37 to a glass substrate 34. In use, the sensor electrode 35 is arranged to detect the distance between a glass substrate 34 and the CVD coater 9. The sensor unit 37 is arranged to send signals to the control unit 38 via the cable 39, wherein said signals indicate the distance between the glass substrate 34 and the CVD coater 9. In addition to controlling the operation of any sensor units 37 to which it is connected, the control unit 38 may also control the operation of the CVD coater 9 or may be connected to a separate control unit for controlling the CVD coater 9. The control unit 38 allows an operator to control the distance between the glass substrate 34 and the CVD coater 9, e.g. the control unit 38 is arranged to automatically maintain a constant distance between the glass substrate 34 and the CVD coater 9 if desired. The control unit 38 is also arranged to audibly and/or visually warn an operator if the CVD coater 9 is closer to the glass substrate 34 than a pre-determined minimum distance of e.g. about 2-30 mm, preferably about 2-10 mm.

Cable 39 is a triaxial cable with a fine copper wire thermally insulated with ceramic beads and successively surrounded by copper tubing, fibreglass and braided stainless steel mesh. Sensor unit 37 comprises a cylindrical copper sensor electrode 35 partially surrounded successively by mica, a copper guard ring and a second layer of mica. The sensor unit 37 is contained in a stainless steel housing.

Figure 4:
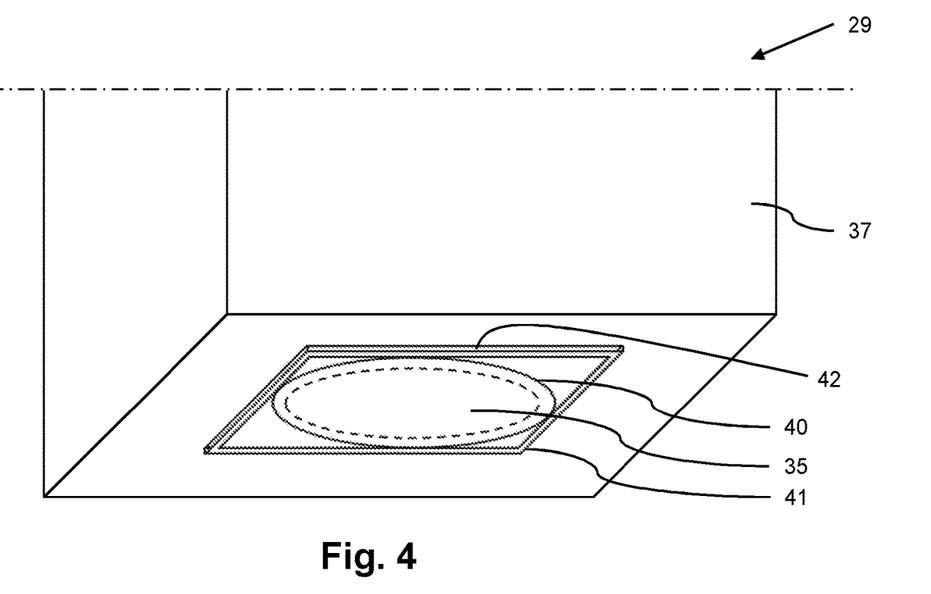
FIG. 4 is a cut away perspective view of an end of a sensor unit of a capacitive proximity sensor in accordance with the present invention.

FIG. 4 shows a cut away perspective view of an end of a sensor unit 37 of a capacitive proximity sensor 29 in accordance with the present invention. Sensor unit 37 is partially surrounded by a cuboid-shaped housing. Shown in outline at one end of the sensor unit 37 is the end of cylindrical sensor electrode 35, which would be exposed to the surrounding atmosphere but for the presence of an anti-fouling sheet 40 in the form of a 0.5 mm thick, 30 mm circumference alumina disc. This anti-fouling sheet 40 is held in place by holder 41 which is a square-shaped frame with a slot 42 for easy insertion and removal of sheet 40 when it needs replacing, which can conveniently be undertaken between CVD coating runs.

EXAMPLES

Testing Sensor Variation Over Time in Float Bath Section

A capacitive proximity sensor in accordance with FIG. 3 was attached to a CVD coater such that the sensor electrode was level with the lower surface of the CVD coater. The coater was then tested in a float bath section set to a temperature of 755° C. The CVD coater was lowered towards the surface of the float bath until it was 5-6 mm from the surface. The variation of the readings provided by the capacitive proximity sensor was then assessed over the course of several hours. The results are shown in Table 1 below.

TABLE 1

Distance between capacitive proximity sensor and glass ribbon detected by sensor over time

| Time (hrs:mins) | Distance (mm) |
|---|---|
| 10:26 | 5.42 |
| 10:32 | 5.44 |
| 10:36 | 5.4 |
| 10:43 | 5.36 |
| 11:30 | 5.36 |
| 11:42 | 5.28 |
| 11:49 | 5.28 |
| 14:41 | 6 |
| 14:44 | 6.02 |
| 14:53 | 5.99 |
| 14:54 | 6.07 |
| 15:44 | 5.97 |
| 15:46 | 6 |
| 15:47 | 5.94 |
| 16:36 | 6.11 |

As can be noted from Table 1, there was no drift in the detected values over the six hours. The only significant shift occurred around 14:30 when there was a change in the height of the glass ribbon which was duly detected by the sensor. The tiny fluctuations detected over the rest of duration are consistent with typical variations in ribbon surface height.

Comparing Capacitive Proximity Sensor with Micrometer in Presence of Alumina Disc A capacitive proximity sensor in accordance with FIG. 3 incorporating an alumina anti-fouling sheet in accordance with FIG. 4 was attached to a CVD coater such that the sensor electrode was level with the lower surface of the CVD coater. A micrometer was used to position the lower surface of the coater at a number of predetermined distances from a stainless steel plate. At each predetermined distance the distance detected by the capacitive proximity sensor was recorded and the results are shown below in Table 2 and in FIG. 5.

TABLE 2

Comparison of distances determined with micrometer and distances recorded with capacitive proximity sensor

| Distance determined with micrometer (mm) | Distance recorded with sensor (mm) |
|---|---|
| 0 | 0.4 |
| 1 | 1.26 |
| 2 | 2.25 |
| 3 | 3.29 |
| 4 | 4.34 |
| 5 | 5.47 |
| 6 | 6.48 |

Figure 5:
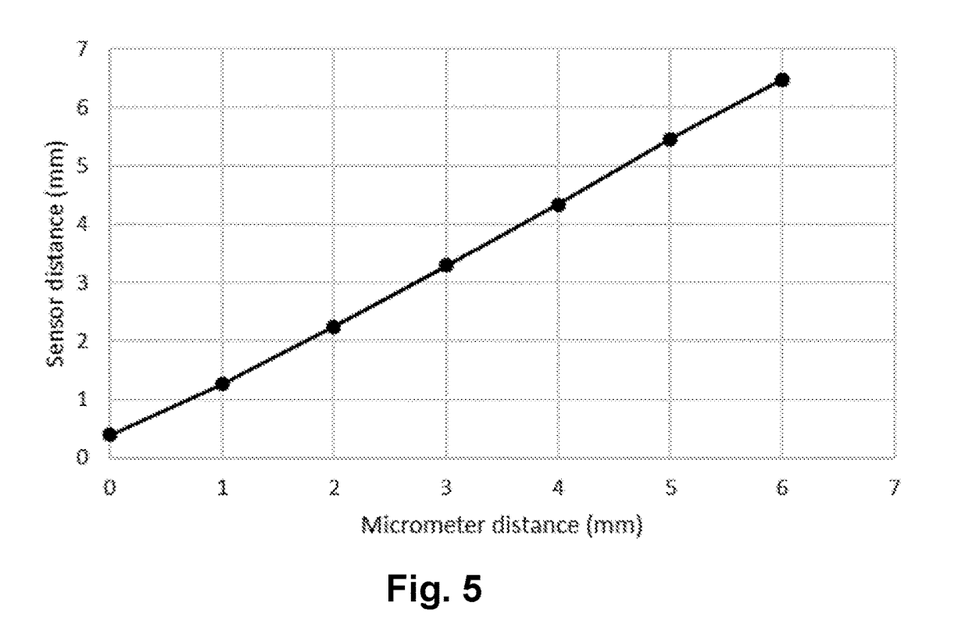
FIG. 5 is a graph of distances determined with a micrometer versus distances recorded with capacitive proximity sensor in accordance with the present invention.

Table 2 and FIG. 5 show that the presence of the alumina disc affected the distance indicated by the sensor. However this difference was predictable and therefore the sensor could easily be calibrated before use to obtain accurate values.

The invention is not restricted to the details of the foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A combination of a chemical vapour deposition (CVD) coater and at least one capacitive proximity sensor, comprising: a CVD coater located in a float bath section, an annealing lehr or a lehr gap of a float glass installation, and at least one capacitive proximity sensor attached to the CVD coater; wherein the at least one capacitive proximity sensor is arranged to determine the distance between a glass substrate and the CVD coater, and wherein the combination is suitable for use during the float glass manufacturing process.

2. The combination according to claim 1, wherein the capacitive proximity sensor comprises a sensor unit, a control unit and a cable, wherein the sensor unit and the control unit are arranged to be electrically coupled to each other by the cable when in use.

3. The combination according to claim 2, wherein the sensor unit and the cable can operate at temperatures of at least 650° C., more preferably at least 700° C., even more preferably at least 750° C., most preferably at least 800° C.

4. The combination according to claim 1, wherein the CVD coater is arranged to move to change the distance between a surface of the glass substrate and a surface of the CVD coater.

5. The combination according to claim 1, wherein the combination comprises more than one capacitive proximity sensor attached to the CVD coater.

6. The combination according to claim 2, wherein the sensor unit is at least partially surrounded by a housing, wherein part of the CVD coater constitutes part of the housing, wherein the temperature of the part of the coater that constitutes part of the housing is regulated using a coolant means, and wherein the temperature of the sensor unit is regulated by the part of the coater that constitutes part of the housing.

7. The combination according to claim 2, wherein at least part of the sensor unit is protected from the surrounding atmosphere by an anti-fouling coating and/or an anti-fouling sheet.

8. The combination according to claim 7, wherein any part of the sensor unit that would otherwise be exposed to the surrounding atmosphere is protected from the surrounding atmosphere by an anti-fouling coating and/or an anti-fouling sheet.

9. The combination according to claim 7, wherein the anti-fouling coating comprises an electrically non-conductive material, preferably one or more of bicarbonates such as sodium bicarbonate and calcium bicarbonate, sulphates such as sodium sulphate and calcium sulphate, nitrides such as boron nitride and aluminium nitride, low boiling point hydrogen treated naphtha, silazanes such as polysilazanes, alkali silicates, silicas and/or organo silicas.

10. The combination according to claim 7, wherein the anti-fouling coating and/or anti-fouling sheet is removable.

11. The combination according to claim 7, wherein the anti-fouling sheet comprises one or more of alumina, quartz, zirconia, and/or an electrically non-conductive ceramic.

12. The combination according to claim 7, wherein the housing or the sensor unit comprises a holder suitable for holding the anti-fouling sheet, preferably wherein the holder comprises a slot arranged to accept the anti-fouling sheet.

13. The combination according to claim 2, wherein the control unit provides means for an operator to control the distance between the glass substrate and the CVD coater.

14. The combination according to claim 2, wherein the control unit is arranged to warn an operator if the CVD coater is closer to the glass substrate than a pre-determined minimum distance.

15. A process for determining the distance between a glass substrate and a CVD coater, comprising the following steps:
   i) providing a glass substrate and a combination of a CVD coater and a capacitive proximity sensor in accordance with claim 1, and
   ii) utilizing the capacitive proximity sensor to determine the distance between the glass substrate and the CVD coater.

16. The process according to claim 15, wherein the process is carried out when the glass substrate is at a temperature in the range 450° C. to 800° C., preferably in the range 550° C. to 770° C.

17. A combination of a chemical vapour deposition (CVD) coater and at least one capacitive proximity sensor, comprising: a CVD coater, and at least one capacitive proximity sensor attached to the CVD coater; wherein the at least one capacitive proximity sensor is arranged to determine the distance between a glass substrate and the CVD coater, and wherein the combination is suitable for use during the float glass manufacturing process, wherein the glass substrate is a molten glass ribbon.

\* \* \* \* \*